United States Patent [19]
Schreck et al.

[11] Patent Number: 5,132,933
[45] Date of Patent: Jul. 21, 1992

[54] BIAS CIRCUITRY FOR NONVOLATILE MEMORY ARRAY

[76] Inventors: John F. Schreck, 10618 Moonlight, Houston, Tex. 77096; Shailesh R. Kadakia, 6522 Smoke Tree La., Sugar Land, Tex. 77479; Phat C. Truong, 15815 Val Vista, Houston, Tex. 77083

[21] Appl. No.: 631,606

[22] Filed: Dec. 21, 1990

[51] Int. Cl.$^5$ .................................. G11C 5/14
[52] U.S. Cl. ................... 365/226; 365/104; 365/185; 365/230.06; 365/189.09
[58] Field of Search ........... 365/184, 185, 104, 230.06, 365/226, 189.09

[56] References Cited

U.S. PATENT DOCUMENTS

| | | | |
|---|---|---|---|
| 4,281,397 | 7/1981 | Neal et al. | 365/185 |
| 4,301,518 | 11/1981 | Klass | 365/185 |
| 4,404,659 | 9/1983 | Kihara et al. | 365/185 |
| 4,723,225 | 2/1988 | Kaszubinski et al. | 365/185 |
| 4,725,980 | 2/1988 | Watimoto et al. | 365/104 |
| 4,868,790 | 9/1989 | Wilmoth et al. | 365/104 |
| 4,912,676 | 3/1990 | Paterson et al. | 365/185 |
| 4,992,980 | 2/1991 | Park et al. | 365/104 |

OTHER PUBLICATIONS

B. Ashmore et al, "A 20 ns 1MB CMOS Burstmode Eprom," 1989 IEEE Int. S-S ckts Conf., Feb. 15, 1989 pp. 40–41.

N. Ohtsuka et al., "A 62 ns 16 Mb CMOS Eprom W. Address Trans. Det. Tech," 1991 IEEE Int. S-S ckts Conf., Feb. 15, 1991, pp. 262–263.

Primary Examiner—Joseph E. Clawson, Jr.
Attorney, Agent, or Firm—Theodore D. Lindgren; Lawrence J. Bassuk; Richard L. Donaldson

[57] ABSTRACT

A biasing circuit for reading a selected cell of an array of semiconductor memory cells in which each cell is coupled to a drain-column line, a source-column line and a wordline, with the selected cell coupled to a selected drain-column line, a selected source-column line, and a selected wordline. The circuit includes a common node; a resistor means coupled between the common node and each of the source- and drain-column lines; a drain-select means coupled to each drain-column line for transmitting, during a read cycle, a first preselected bias voltage lower than a supply voltage to the selected drain-column line; a source-select means coupled to each source-column line for transmitting, during the read cycle, a second preselected bias voltage to the one non-selected source-column line, the one non-selected source-column line coupled to a cell sharing the selected drain-column line and the selected wordline; and reference-select means for connecting, during the read cycle, the source-column lines, except the one non-selected source-column line, to reference potential. The sense amplifier and the driver circuit each include at least three transistors and have outputs coupled to drain-column lines and source-column lines, respectively, of the memory array.

25 Claims, 3 Drawing Sheets

| ADDRESS INPUT | | | | | | |
|---|---|---|---|---|---|---|
| PRE-DECODER | | | | | | |
| PROGRAM PATH | | | | | | |
| REDUNDANT ROWS | WORDLINE DECODER AND DRIVERS | REDUNDANT COLUMNS | REDUNDANT ROWS | REDUNDANT ROWS | WORDLINE DECODER AND DRIVERS | REDUNDANT ROWS |
| 512x512 MEMORY CELL ARRAY | | | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | | COLUMN/ SEGMENT PASS GATES | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | REDUNDANT COLUMNS REDUNDANT COLUMNS | 512x512 MEMORY CELL ARRAY | 512x512 MEMORY CELL ARRAY | WORDLINE DECODER AND DRIVERS | 512x512 MEMORY CELL ARRAY |
| 512x512 MEMORY CELL ARRAY | | | 512x512 MEMORY CELL ARRAY | 512x512 MEMORY CELL ARRAY | | 512x512 MEMORY CELL ARRAY |
| COLUMN/ SEGMENT PASS GATES | SEGMENT DECODER | | COLUMN/ SEGMENT PASS GATES | COLUMN/ SEGMENT PASS GATES | SEGMENT DECODER | COLUMN/ SEGMENT PASS GATES |
| 512x512 MEMORY CELL ARRAY | WORDLINE DECODER AND DRIVERS | REDUNDANT COLUMNS | 512x512 MEMORY CELL ARRAY | 512x512 MEMORY CELL ARRAY | WORDLINE DECODER AND DRIVERS | 512x512 MEMORY CELL ARRAY |
| VIRTUAL GROUND DECODER | COLUMN DECODER | | VIRTUAL GROUND DECODER | VIRTUAL GROUND DECODER | COLUMN DECODER | VIRTUAL GROUND DECODER |
| SENSE AMPS | | | SENSE AMPS | SENSE AMPS | | SENSE AMPS |

DATA INPUT/OUTPUT

FIG. 1

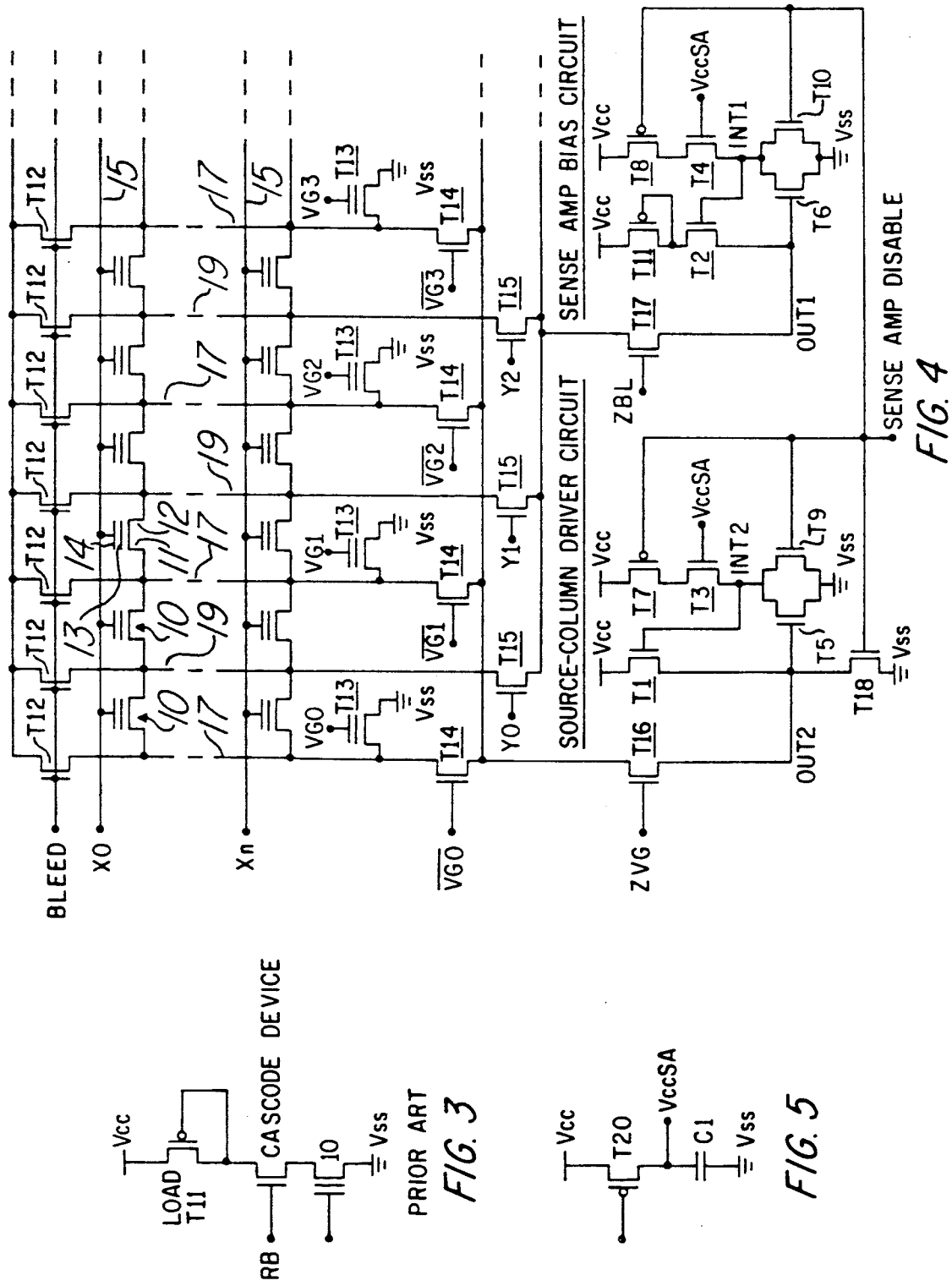

BIAS CIRCUITRY FOR NONVOLATILE MEMORY ARRAY

BACKGROUND OF THE INVENTION

This invention relates to integrated-circuit, nonvolatile memory arrays, including electrically-programmable, read-only memory (EPROM) arrays, and to circuitry for biasing the column lines of such arrays.

In particular, the invention relates to circuitry for maintaining the voltages of the column lines of such arrays at desired levels.

An EPROM array is one example of an integrated circuit that in which the circuit and method of this invention may be used. EPROM arrays include floating-gate memory cells arranged in rows and columns. The floating gate of a programmed memory cell is charged with electrons, and the electrons in turn render the source-drain path under the charged floating gate nonconductive when a chosen row-line select voltage is applied to the control gate. The nonconductive state is read as a "zero" bit. The floating gate of a non-programmed cell is neutrally charged such that the source-drain path under the non-programmed floating gate is conductive when the same chosen row-line select voltage is applied to the control gate. The conductive state is read as a "one" bit.

Each column and row of an EPROM array may contain thousands of cells. The sources of each cell in a column are connected to a virtual-ground line (source-column line). The drains of each cell in a column are connected to a separate bitline (drain-column line). The control gates of each cell in a row are connected to a wordline.

During cell programming, appropriate programming voltages are applied to the selected control-gate wordline and the selected drain-column line to create a high-current condition in the selected channel region, injecting channel-hot electrons and/or avalanche-breakdown electrons across the channel oxide to the floating gate.

Previous biasing circuits for virtual-ground memory arrays have biased the entire memory array, including biasing both drain-column lines and source-column lines (the latter also called virtual-ground lines). Biasing of that type is described in U.S. Pat. No. 4,722,075. The advantage of the biasing arrangement described in that patent is that all column lines are connected by a resistance to a common node, guaranteeing that all column lines (selected and deselected) have a discharging, or a charging, path such that none of the column lines are allowed to float. In the virtual-ground-array patent (U.S. Pat. No. 4,281,397), certain source-column lines are charged through a diode. That is, the deselected source-column lines nearest the memory cell being read are charged by a N-channel field-effect transistor configured as a diode. The diode-connected transistor provides no discharge path for the source-column lines. A discharge path is necessary for response to power supply voltage changes or for response to parasitic leakage paths to a higher-than-intended potential applied to an array terminal.

An inability to maintain source-column lines at the correct levels causes a difficult problem where a virtual-ground memory array has high operating speed requirements and/or has high capacitance source-column lines. When reading a conducting memory cell in such a virtual-ground memory array, if the memory cell sharing the same drain-column line and the same wordline has its source-column line at a higher voltage level than the drain-column line voltage level required for accurate sensing, the cell being read must also discharge that higher-voltage-level source-column line. The added discharge requirement slows the access time required to read the selected conducting memory cell.

The biasing arrangement disclosed in U.S. Pat. No. 4,722,075 is difficult to use with sense amplifiers having cascode circuits. When using cascode-type sense amplifiers, the bias set by the cascode devices on the drain-column lines must match the bias on the source-column lines. If the bias is not matched, the currents caused by the voltage differentials will degrade sensing capability. In addition, if the biasing arrangement disclosed in U.S. Pat. No. 4,722,075 is used in segmented architectures, the bias devices must be repeated in every segment.

There is a need for a circuit and method to control the biasing voltages on both the drain-column lines and the source-column lines of high-speed segmented virtual-ground memory arrays in a manner that overcomes the problems described above.

SUMMARY OF THE INVENTION

The circuitry and process of this invention provide for control of the biasing voltages on the drain-column lines and the source-column lines of memory arrays by providing a continual discharge path for each such column line. Furthermore, the circuit allows acceptably small differences between voltages on the selected drain-column line and voltages on the deselected source-column lines sharing that selected drain-column line. The continual-discharge mechanism has a sufficiently large resistance that it does not interfere with reading cells in non-conducting states. In addition, the small-current discharge, when used with a cascode-type sense amplifier, maintains an effective quiescent state under wide high-frequency variations in power supply voltage.

The biasing circuit is used for reading a selected cell of an array of semiconductor memory cells in which each said cell is coupled to a drain-column line, a source-column line and a wordline, with the selected cell coupled to a selected drain-column line, a selected source-column line, and a selected wordline. The circuit includes a common node; a resistor means coupled between the common node and each of the source- and drain-column lines; a drain-select means coupled to each drain-column line for transmitting, during a read cycle, a first preselected bias voltage lower than a supply voltage to a selected said drain-column line; a source-select means coupled to each said source-column line for transmitting, during said read cycle, a second preselected bias voltage to one non-selected source-column line, the one non-selected source-column line coupled to a cell sharing the selected drain-column line and the selected wordline; and reference-select means for connecting, during the read cycle, the source-column lines, except the one non-selected source-column line, to reference potential.

The sense amplifier and the driver circuit each include at least three transistors and have outputs coupled to drain-column lines and source-column lines, respectively, of the memory array. For each, a first transistor of a first conductivity-type has a source-drain path connected between an intermediate terminal and reference potential and a gate connected to the output. A second transistor has a source-drain path connected between the supply voltage and the intermediate terminal and a gate connected to a bias signal voltage. A third transistor has a source-drain path connected between a load or the supply voltage and the output and a gate connected to the intermediate terminal.

BRIEF DESCRIPTION OF THE DRAWINGS

In the drawings:

FIG. 1 is a representation of an integrated circuit layout for a four-megabit EPROM array;

FIG. 3 is a representation of an input circuit of a prior-art cascode-type sense amplifier;

FIG. 4 is a schematic representation of the bias circuitry of this invention; and FIG. 5 is a schematic representation of the filter circuit of the bias circuitry of FIG. 4.

DETAILED DESCRIPTION OF THE SPECIFIC EMBODIMENT

Figure 2:
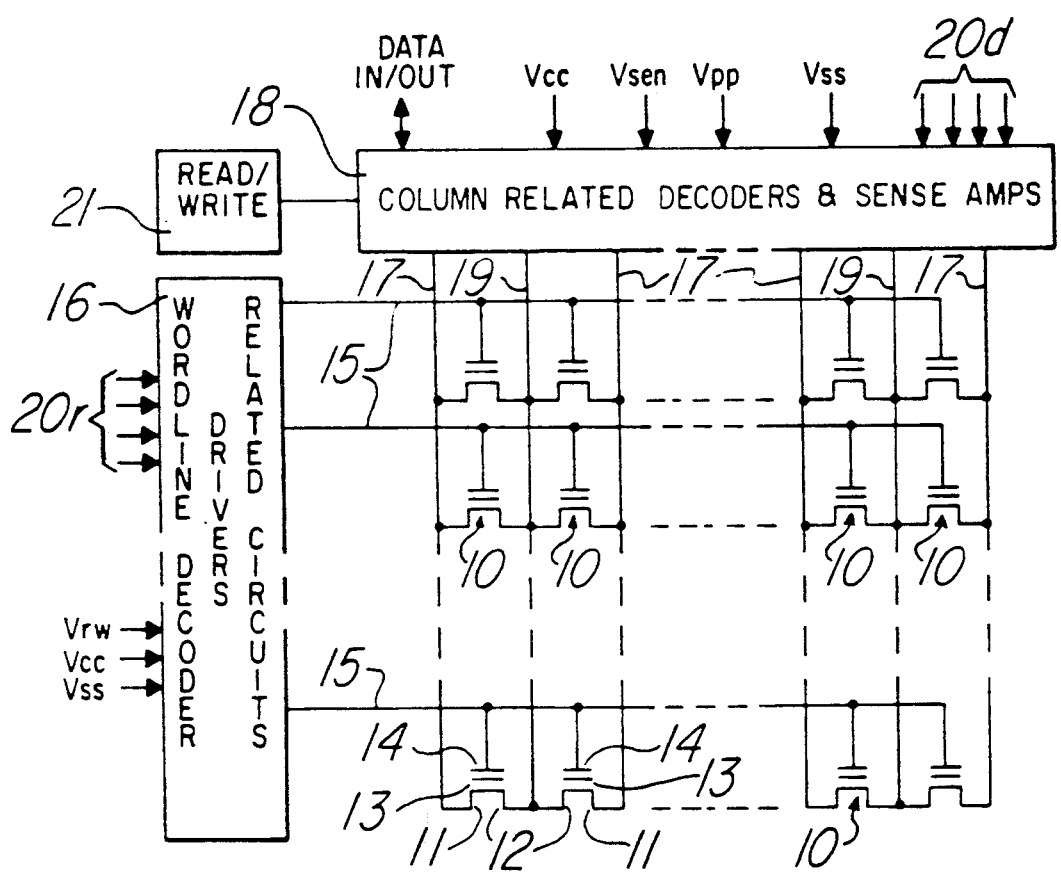
FIG. 2 is a representation of a part of a memory cell array and associated circuitry of the integrated circuit of FIG. 1.

Referring to FIG. 1, an example of an integrated circuit layout for a nominal four-megabit EPROM is illustrated. The layout, in which dimensional proportions are not those of actual manufacture, illustrates sixteen 512×512 memory sub-arrays with redundant rows and columns used to replace rows and columns having defective cells. Peripheral circuitry, including wordline decoders, column decoders, virtual-ground decoders, wordline drivers, and column/segment pass gates, all of which function to connecting reading and programming voltages to the rows and columns of cells in response to address inputs routed through a predecoder and program path. Data are written into the memory arrays during programming operations. During reading operations, data from the memory arrays are routed through sense amplifiers to the output.

Referring to FIG. 2, an example array of memory cells, which is a part of a memory chip such as that illustrated in FIG. 1, is shown. Each cell is a floating-gate transistor 10 having a source 11, a drain 12, a floating gate 13 and a control gate 14. Each of the control gates 14 in a row of cells 10 is connected to a wordline 15 (or row line 15), and each of the wordlines 15 is connected to a wordline circuit 16, which includes wordline decoders, drivers and related circuitry. Each of the sources 11 in a column of cells 10 is connected to a source-column line 17 (which may be a virtual-ground line), and each of the source-column lines 17 is connected to a column circuit 18, which includes column-/segment decoders, virtual ground decoders and column/segment pass gates. Each of the drains 12 in a column of cells 10 is connected to a drain-column line 19, and each of the drain-column lines 19 is connected to the column circuit 18.

In a write or program mode, the wordline circuit 16 may function, in response to wordline address signals on lines 20r and to signals from Read/Write control circuit 21, (or a microprocessor 21) to place a preselected first programming voltage Vpp (approx. +12.5 V) on a selected wordline 15, including a selected control-gate conductor 14. Column circuit 18 also functions to place a second programming voltage Vrw (Vpp reduced through an impedance to approx. +5 to +10 V) on a selected source-column line 17 and, therefore, the source region 11 of selected cell 10. The selected drain-column line 19 is connected to reference potential Vss. Deselected source-column lines 17 and deselected drain-column lines 19 are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region. The injected electrons and negative voltage in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

Erasing of cells may be accomplished, for example, by ultraviolet radiation.

In the read mode, the wordline circuit 16 functions, in response to wordline address signals on lines 20r and to a signal from Read/Write control circuit 21, to apply a preselected positive voltage Vcc (approx. +3 to +5 volts) to the selected wordline 15 (and the selected control gate 14), and to apply a low voltage (ground or Vss) to deselected wordlines 15. The column circuit 18 functions, in response to column address signals on lines 20d, causes a sense amplifier to apply a preselected positive voltage Vsen (approx. +1 to +1.5 volts) to the selected drain-column line 19. The column circuit 18 also functions to connect all of the source-column lines 17 to ground (or Vss) except for the source-column line 17 sharing the same drain-column line connected to the cell 10 that is being read. That source-column line 17 is driven to the same voltage level as the selected drain-column line. The conductive or nonconductive state of the cell 10 connected to the selected drain-column line 19 and the selected wordline 15 is detected by a sense amplifier connected to the DATA OUT terminal.

As is well-known, the source 11 regions and the drain 12 regions of the memory cells 10 may be interchanged for the various modes of operation. Voltages applied to the source 11 and drain 12 regions in the read example above are interchangeable. Therefore, the terms "source" and "drain" as used herein are interchangeable.

FIG. 3 shows a CASCODE DEVICE, such as used in the biasing portion of many prior-art sense amplifiers, connected in series with a LOAD transistor T11 and a memory cell 10, the three elements connected in series between supply voltage Vcc and reference potential Vss. A reference-bias potential RB is connected to the gate of the CASCODE DEVICE. The upper limit of the voltage across the source-drain path of memory cell 10 is equal to reference-bias potential RB less the voltage threshold Vt of the CASCODE DEVICE.

Referring to FIG. 4, the circuit illustrated includes a common node N; a resistor means, such as transistors T12, coupled between the common node N and each of the source- and drain-column lines 17 and 19; a drain-select means, such as transistors T15, coupled to each drain-column line 19 for transmitting, during a read cycle, a first preselected bias voltage lower than a supply voltage Vcc to a selected drain-column line 19; a source-select means, such as transistors T14, coupled to each source-column line 17 for transmitting, during the read cycle, a second preselected bias voltage to a one non-selected source-column line 17, the one non-selected source-column line 17 coupled to a cell 10 sharing the selected drain-column line 19 and the selected wordline 15; and reference-select means, such as transistors T13, for connecting, during the read cycle, the source-column lines 17, except the one non-selected source-column line 17, to reference potential Vss.

Referring again to FIG. 4, in which a portion of the array of FIGS. 1 and 2 is shown in greater detail, transistors T12 provide a continual discharge path for every column line 17 and 19. Each transistors T12 is connected between a common node N and a column line 17 or 19. The voltage applied to the gates of transistors T12 at the terminal designated BLEED is set to a voltage that limits the current through transistors T12 to a small value. The voltage at the BLEED terminal is derived from a current-mirror circuit or by another of the well-known circuits for such purpose. It should be noted that the node N is not connected to reference potential Vss. The read operation voltages are chosen such that the discharge current flows to the source of reference potential Vss through the selected source-column line 17 and through the deselected source-column lines 17, which are driven to ground if they do not share a common drain-column line 19 with the drain-column line 19 being sensed. Since predominantly all of the source-column lines 17 are grounded, a discharge path is assured.

During reading of a selected cell 10, the selected drain-column line 19 is biased by the SENSE AMP BIAS CIRCUIT through a drain-column-select transistor T15 and a partial-array select transistor T17 in response to appropriate signals YO-YN and ZBL. Only the source-column line 17 connected to the deselected cell 10 that shares the selected drain-column line 19 and that is also connected to the same wordline 15 is biased by the SOURCE-COLUMN DRIVER CIRCUIT through a source-column-select transistor T14 and a partial-array select transistor T16 in response to appropriate signals VGO-VGN (the complement of signal VGO-VGN) and ZVG. All other deselected source-column lines 17 are driven to reference potential Vss by transistors T13 in response to appropriate signals VGO-VGN. All deselected drain-column lines 19 are floated, except to the extent that connection to reference potential Vss is supplied through discharge transistors T12.

The SENSE AMP BIAS CIRCUIT of FIG. 4 has a first terminal labeled OUT1 coupled to drain-column lines 19 of the memory array. A first N-type transistor T6 of a first conductivity-type has a source-drain path connected between an intermediate terminal INT1 and reference potential Vss and has a gate connected to the array output OUT1. A second N-type transistor T4 has a source-drain path connected between the supply voltage Vcc and the intermediate terminal INT1 and a gate connected to the bias signal voltage VccSA. A third N-type transistor T2 has a source-drain path connected between sense amplifier load resistor/transistor T11 and the output OUT1 and a gate connected to the intermediate terminal INT1.

The SOURCE-COLUMN DRIVER CIRCUIT of FIG. 4 has an output OUT2 coupled to the source-column lines 17 of the memory array. A first N-type transistor T5 has a source-drain connected between an intermediate terminal INT2 and a reference potential Vss and has a gate coupled to the output OUT2. A second N-type transistor T3 has a source-drain path connected between supply voltage Vcc and the intermediate terminal INT2 and has a gate connected to bias signal voltage VccSA. A third N-type transistor T1 has a source-drain path connected between the supply voltage Vcc and the output OUT2 and has a gate connected to the intermediate terminal INT2.

The first and second bias voltage levels for the selected drain-column line 19 and the biased deselected source-column line 17 are provided through transistors T2 and T1. The bias levels are determined by N-channel field-effect transistor pairs T4,T6 and T3,T5. The N-channel pairs T3,T5 and T4,T6 form low-gain inverters that set the bias levels for biased source-column lines 17 and selected drain-column lines 19 to a voltage near the N-channel voltage threshold Vt value of transistors T5 and T6. Switching transistors T7,T9, T8, T10 and T18 are means for disabling the SOURCE-COLUMN DRIVER CIRCUIT and the SENSE AMP BIAS CIRCUIT in response to a signal at the SENSE AMP DISABLE terminal. Transistors T1, T3 and T5 are matched in type and in size to their corresponding transistors T2, T4 and T6. They are matched to maintain the biased source-column line 17 as close to the biased selected drain-column line 19 as possible.

In addition to providing the bias voltages to the array, transistors T4 and T3 also serve, in combination with signal VccSA, as a Vcc noise filter. Since transistors T3 and T4 are N-channel devices connected in saturation, their drain-source current is a function of each transistor's corresponding gate-to-source potential as long as (Vgate - Vsource - Vt) < (Vdrain- Vsource). The filtering occurs because VccSA is coupled by high capacitance to reference potential Vss and by only resistance to supply voltage Vcc.

Referring now to FIG. 5, a filter circuit for providing the voltage VccSA is illustrated. The combination of resistor/transistor T20 and capacitor C1 are chosen to have an approximately 20 microsecond time constant so that VccSA will not change value (effectively) with changes in supply voltage Vcc occurring at frequencies below one megaHertz. Therefore, the noise is much lower than would otherwise be expected. The long time constant is also chosen to guarantee that transistors T12 will continuously maintain the array column lines 17 and 19 at bias levels determined predominantly by transistors T1 and T2 or is chosen such that some small current always flows through transistors T1 and T2.

It is apparent that, if the voltage at nodes common to transistor pairs T3,T5 and T4,T6 does not vary with Vcc, then the array bias voltages also do not vary.

In applications where power consumption must be reduced, the BLEED terminal is driven to a low voltage during low power states, thereby disconnecting the source Vss of ground potential. The discharging condition may be continued by raising the voltage of a wordline connected to all conducting cells, then grounding any one array node within a common section of the array. In should be noted, however, that BLEED terminal has, in general, a high impedance and cannot be driven to a low voltage quickly.

The discharge mechanism described herein is applicable to non-virtual ground arrays and the sense-amplifier/filter combination described herein is applicable to many different types of sense amplifiers.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A circuit for reading a selected cell of an array of semiconductor memory cells, each said cell coupled to a drain-column line, a source-column line and a wordline, said selected cell coupled to a selected drain-column line, a selected source-column line, and a selected wordline, said circuit comprising:

a common node;

a resistor means coupled between each said source-column line and said common node and between each said drain-column line and said common node;

a drain-select means coupled to each said drain-column line for transmitting, during a read cycle, a first preselected bias voltage lower than a supply voltage to said selected drain-column line;

a source-select means coupled to each said source-column line for transmitting, during said read cycle, a second preselected bias voltage to one non-selected source-column line, said one non-selected source-column line coupled to a cell sharing said selected drain-column line and said selected wordline; and a reference-select means coupled to each said source-column line for connecting, during said read cycle, each said source-column line, except said one non-selected source-column line, to said reference potential.

2. The circuit of claim 1, wherein said resistor means includes a plurality of transistors with source-drain paths coupled between said column lines and said common node and with gates connected to a high impedance voltage source.

3. The circuit of claim 1, wherein said drain-select means includes a transistor with source-drain path coupled between said first preselected bias voltage and said drain-column line and with gate coupled to a drain-column select signal.

4. The circuit of claim 1, wherein said source-select means includes a transistor with source-drain path coupled between said second preselected bias voltage and said source-column line and with gate coupled to a source-column-select signal operative to make said source-select means nonconductive except when said source-select means is connected to said one non-selected source-column.

5. The circuit of claim 1, wherein said reference-select means includes a transistor with source-drain path coupled between said source-column line and said reference potential and with gate coupled to a complement of source-column-select signals operative to make said reference-select means conductive except when said reference-select means is connected to said one non-selected source-column line.

6. The circuit of claim 1, wherein said first preselected bias voltage and said second preselected bias voltage are substantially equal.

7. The circuit of claim 1, wherein said array is one of a number of arrays.

8. The circuit of claim 1, wherein said first preselected bias voltage is supplied by a sense amplifier.

9. The circuit of claim 1, wherein said second preselected bias voltage is supplied by a source-column driver circuit.

10. A circuit for reading a selected cell of an array of semiconductor memory cells, each said cell coupled to a drain-column line, a source-column line and a wordline, said selected cell coupled to a selected drain-column line, a selected source-column line, and a selected wordline, said circuity comprising:

a common node;

a resistor means coupled between each said source-column line and said common node and between each said drain-column line and said common node;

a drain-select means coupled to each said drain-column line for transmitting, during a read cycle, a first preselected bias voltage lower than a supply voltage to said selected drain-column line;

a source-select means coupled to each said source-column line for transmitting, during said read cycle, a second preselected bias voltage to one non-selected source-column line, said one non-selected source-column line coupled to a cell sharing said selected drain-column line and said selected wordline;

a reference-select means coupled to each said source-column line for connecting, during said read cycle, each said source-column line, except said one non-selected source-column line, to said reference potential;

said resistor means including a plurality of transistors with source-drain paths coupled between said column lines and common node and with gates connected to a high impedance voltage source;

said drain-select means including a transistor with source-drain path coupled between said first preselected bias voltage and said drain-column line and with gate coupled to a drain-column select signal;

said source-select means including a transistor with source-drain path coupled between said second preselected bias voltage and said source-column line and with gate coupled to a source-column-select signal operative to make said source-select means nonconductive except when said source-select means is connected to said non-select source-column line;

said reference-select means including a transistor with source-drain path coupled between said source-column line and said reference potential and with gate coupled to a complement of said source-column-select signals operative to make said reference-select means conductive except when said reference-select means is connected to said non-selected source-column line;

said first preselected bias voltage and said second preselected bias voltage being substantially equal;

said array being one of a number of arrays;

said first preselected bias voltage supplied by a sense amplifier; and said second preselected bias voltage supplied by a source-column driver circuit.

11. A sense amplifier bias circuit having first terminal coupled to a drain-column line of a memory array, comprising:

a first transistor of a first conductivity-type having a source-drain path and a gate, said source-drain path of said first transistor connected between an intermediate terminal and a reference potential, said gate of said first transistor coupled to said first terminal;

a second transistor of said first conductivity-type having a source-drain path and a gate, said source-drain path of said second transistor connected between a supply voltage and said intermediate terminal, said gate of said second transistor connected to a bias signal voltage; and a third transistor of said first conductivity-type having a source-drain path and a gate, said source-drain path of said third transistor connected between a load and said first terminal and said gate of said third transistor connected to said intermediate terminal.

12. The sense amplifier bias circuit of claim 11, including a switching transistor of a second conductivity-type having a source-drain path and a gate, said source-drain path of said switching transistor connected between said supply voltage and said source-drain path of said second transistor, said gate of said switching transistor connected to a sense amplifier disable signal.

13. The sense amplifier bias circuit of claim 11, including a switching transistor of said first conductivity-type, said switching transistor having a source-drain path and a gate, said source-drain path of said switching transistor connected between said intermediate terminal and said reference potential, said gate of said switching transistor connected to a sense amplifier disable signal.

14. The sense amplifier bias circuit of claim 11, wherein said bias signal voltage is formed from a large resistance connected between said gate of said second transistor and said supply voltage and from a large capacitance connected between said gate of said second transistor and said reference potential.

15. A source-column driver circuit having an output coupled to a source-column line of a memory array, comprising:

a first transistor of a first conductivity-type having a source-drain path and a gate, said source-drain path of said first transistor connected between an intermediate terminal and a reference potential, said gate of said first transistor coupled to said output;

a second transistor of said first conductivity-type having a source-drain path and a gate, said source-drain path of said second transistor connected between a supply voltage and said intermediate terminal, said gate of said second transistor connected to a bias signal voltage; and a third transistor of said first conductivity-type having a source-drain path and a gate, said source-drain path of said third transistor connected between said supply voltage and said output and said gate of said third transistor connected to said intermediate terminal.

16. The source-column driver circuit of claim 15, including a switching transistor of a second conductivity-type having a source-drain path and a gate, said source-drain path of said switching transistor connected between said supply voltage and said source-drain path of said second transistor, said gate of said switching transistor connected to a sense amplifier disable signal.

17. The source-column driver circuit of claim 15, including a switching transistor of said first conductivity-type, said switching transistor having a source-drain path and a gate, said source-drain path of said switching transistor connected between said intermediate terminal and said reference potential, said gate of said switching transistor connected to a sense amplifier disable signal.

18. The source-column driver circuit of claim 15, including a switching transistor of said first conductivity-type having a source-drain path and a gate, said source-drain path of said switching transistor connected between said output and said reference potential and said gate of said switching transistor connected to a sense amplifier disable signal.

19. The source-column driver circuit of claim 15, wherein said bias signal voltage is formed from a large resistance connected between said gate of said second transistor and said supply voltage and from a large capacitance connected between said gate of said second transistor and said reference potential.

20. A method of biasing an array of semiconductor memory cells of a type having respective drain-column lines, source-cell column lines and wordlines, comprising:

establishing first and second predetermined bias voltages; and during read modes, transmitting said first bias voltage onto a selected drain-column line and transmitting said second bias voltage onto a non-selected source-column line coupled to a said memory cell sharing said selected drain-column line and sharing a said wordline while coupling all other said source-column lines to reference potential.

21. The method of claim 20, wherein each said source-column line and each said drain-column line are coupled to a common node by a resistance.

22. The method of claim 20, wherein each said soruce- and drain-column line is coupled by a transistor to a common node, each said transistor having a source-drain path connected between said common node and one of said source- and drain-column lines and having a gate connected to a high impedance potential.

23. The method of claim 20, wherein said first bias voltage is transmitted to said drain-column lines by a plurality of drain-select transistors each having a source-drain path connected between said first bias voltage and a said drain-column line and a gate coupled to a drain-column select signal.

24. The method of claim 20, wherein said second bias voltage is transmitted to said source-column lines by a plurality of source-select transistors each having a source-drain path connected between said second bias voltage and a said source-column line and a gate coupled to a source-column select signal.

25. The method of claim 20, wherein said reference potential is coupled to said other source-column lines by a plurality of reference-select transistors each having a source-drain path connected between said reference potential and an a said source-column line and a gate coupled to a complement of a source-column select signal.

* * * * *